(12) United States Patent
Jain et al.

(10) Patent No.: US 6,495,907 B1
(45) Date of Patent: *Dec. 17, 2002

(54) CONDUCTOR RETICULATION FOR IMPROVED DEVICE PLANARITY

(75) Inventors: Manoj Kumar Jain, Plano, TX (US); Michael Francis Chisholm, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/473,404

(22) Filed: Jun. 7, 1995

Related U.S. Application Data (62) Division of application No. 08/315,529, filed on Sep. 30, 1994.

(51) Int. Cl.[7] .............................................. H01L 23/495
(52) U.S. Cl. ........................................ 257/667; 257/669
(58) Field of Search ................................. 257/667, 669, 257/678

(56) References Cited

U.S. PATENT DOCUMENTS 4,625,227 A   11/1986   Hara et al.

(List continued on next page.)

FOREIGN PATENT DOCUMENTS

| EP | 0 363 100 | 4/1990 | ............ H01L/21/76 |
|---|---|---|---|
| EP | 0 588 747 | 3/1994 | ............ H01L/21/76 |
| GB | 2 173822 A | 10/1986 | |
| JP | 57-45259 | 3/1982 | ............ H01L/21/88 |
| JP | 57-207353 | 12/1982 | ............ H01L/21/88 |
| JP | 62-296447 | 12/1987 | ............ H01L/21/92 |
| JP | 5-3164 | 1/1993 | ............ H01L/21/28 |
| JP | 06 318590 | 11/1994 | ....... H01L/21/3205 |

OTHER PUBLICATIONS

Neves Aus Der Technik, vol. 2, May 1987, Wursburg, DE, p. 2, XP002024607 "Verbesserte Planarisierung", whole article.

"Introduction to MOS LSI Design,"University of Edinburgh, pp. 63–64 (J. Mavor; M.A. Jack; P.B. Denyer) (Date unknown).

*Primary Examiner*—Stephen D. Meier
(74) *Attorney, Agent, or Firm*—David Denker; Wade James Brady, III; Frederick J. Telecky, Jr.

(57) ABSTRACT

A semiconductor device and process for making the same are disclosed which use reticulated conductors and a width-selective planarizing interlevel dielectric (ILD) deposition process to improve planarity of an interconnect layer. Reticulated conductor 52 is used in place of a solid conductor where the required solid conductor width would be greater than a process and design dependent critical width (conductors smaller than the critical width may be planarized by an appropriate ILD deposition). The reticulated conductor is preferably formed of integrally-formed conductive segments with widths less than the critical width, such that an ILD 32 formed by a process such as a high density plasma oxide deposition (formed by decomposition of silane in an oxygen-argon atmosphere with a back-sputtering bias) or spin-coating planarizes the larger, reticulated conductor as it would a solid conductor of less than critical width. Using such a technique, subsequent ILD planarization steps by e.g., chemical mechanic polishing or etchback, may be reduced or avoided entirely.

10 Claims, 5 Drawing Sheets

U.S. PATENT DOCUMENTS

| | | | |
|---|---|---|---|
| 4,654,692 A * | 3/1987 | Sakurai | 257/669 |
| 4,797,375 A | 1/1989 | Brownell | 437/187 |
| 4,944,836 A | 7/1990 | Beyer et al. | 156/645 |
| 4,956,313 A | 9/1990 | Cote et al. | 437/203 |
| 5,023,699 A | 6/1991 | Hara et al. | 357/68 |
| 5,089,442 A | 2/1992 | Olmer | |
| 5,229,642 A | 7/1993 | Hara et al. | 257/691 |
| 5,234,868 A | 8/1993 | Cote | 437/225 |
| 5,262,354 A | 11/1993 | Cote et al. | 437/195 |
| 5,270,264 A | 12/1993 | Andideh et al. | 437/228 |
| 5,272,117 A | 12/1993 | Roth et al. | |
| 5,292,689 A | 3/1994 | Cronin et al. | 437/228 |
| 5,300,813 A | 4/1994 | Joshi et al. | 257/752 |
| 5,362,669 A | 11/1994 | Boyd et al. | 437/67 |
| 5,395,790 A | 3/1995 | Lur | 437/69 |
| 5,426,330 A | 6/1995 | Joshi et al. | 257/752 |
| 5,471,091 A | 11/1995 | Pasch et al. | 257/752 |
| 5,494,854 A | 2/1996 | Jain | 437/195 |
| 5,602,423 A | 2/1997 | Jain | 257/752 |
| 5,621,241 A | 4/1997 | Jain | 257/632 |
| 5,686,356 A | 11/1997 | Jain et al. | 437/195 |

* cited by examiner

CONDUCTOR RETICULATION FOR IMPROVED DEVICE PLANARITY

This is a division of application Ser. No. 08/315,529, filed Sep. 30, 1994.

CROSS-REFERENCE TO RELATED APPLICATIONS

The following co-assigned application is included herein by reference:

| Docket # | Serial # | Filing Date | Inventors | Title |
| --- | --- | --- | --- | --- |
| TI-19552 | 08/291636 | 8/17/94 | Jain | Enhancement in Throughput and Planarity During CMP Using a Dielectric Stack Containing HDP-SiO$_2$ Films |

1. Field of the Invention

This invention relates to interconnection layers for microelectronic devices, and more particularly to planarization of insulated interconnection layers.

2. Background of the Invention

Integrated circuits such as those found in computers and electronic equipment may contain millions of transistors and other circuit elements fabricated on a single crystal silicon chip. To achieve a desired functionality, a complex network of signal paths must be routed to connect the circuit elements distributed on the surface of the chip. Efficient routing of signals across a chip becomes increasingly difficult as integrated circuit complexity grows. To ease this task, interconnection wiring, which not too many years ago was limited to a single level of metal conductors, on today's devices may contain as many as five (with even more desired) stacked interconnected levels of densely packed conductors. Each individual level of conductors is typically insulated from adjacent levels by an interlevel dielectric (ILD) such as a silicon dioxide film.

Conductors typically are formed by depositing one or more layers of conductive film over an insulated substrate (which usually contains vias, or through holes, allowing the conductive film to contact underlying circuit structure where electrical connections are needed). Portions of the conductive film are selectively etched away using a mask pattern, leaving a pattern of separate conductors with similar thickness and generally rectangular cross-section on the substrate. Usually, after patterning, the conductors are covered with an ILD before additional conducting layers are added.

Ideally, a completed ILD has a planar upper surface. This ideal is not easily achieved and in multilayer conductor schemes, the inherent topography of the underlying conductors is often replicated on the ILD surface. After several poorly planarized layers of ILD with imbedded conductors are formed, problems due to surface topography that adversely affect wiring reliability are likely to occur, e.g., uneven step coverage or via under/overetching.

To overcome such problems, several methods are in common use for ILD planarization. Chemical mechanical planarization (CMP) abrasively polishes the upper surface of the ILD to smooth topography. Another approach is the etchback process, which generally requires depositing a sacrificial spin-on layer which smooths topography (such as photoresist) over the ILD. The sacrificial layer is etched away, preferably with an etchant which etches the ILD material at a similar rate. Done correctly, the etchback reduces high spots on the ILD layer more than it reduces low spots, thus effecting some level of planarization. Both of these methods can be expensive, time-consuming, and generally require a thick initial ILD deposition, since a top portion of the ILD is removed during planarization.

SUMMARY OF THE INVENTION

The present invention provides interconnect structures and methods for increased device planarity. A typical interconnection level contains conductors of several different widths. Conductors which will carry a small current during operation may be layed out using a minimum width established in the design rules for a specific fabrication process. Other conductors which must carry larger current or conform to other design requirements (e.g. alignment tolerances) may be layed out with larger widths. Generally, the largest conducting regions, such as power bus lines and bondpads. are formed on the topmost conducting level, where planarization is not a great concern.

It has now been found that certain ILD deposition processes may naturally planarize conductors (i.e. create a planar ILD upper surface over the conductor edge) narrower than a critical width. Given a specific conductor height, desired ILD deposition depth, and desired planarity, the critical width may be determined for such processes, usually by experimentation. The present invention exploits this property on a conducting level where it is desired to construct a variety of conductors, some of which require a width greater than the critical width. It has now been found that a network of integrally-formed conducting segments may be used to form a conductor which improves ILD deposition planarity and provides a large conductive cross-section. This is apparently the first use of a reticulated (i.e. meshlike) conductor structure to improve ILD planarity. Although such a conductor may require more surface area on the substrate (as compared to a non-reticulated conductor of equivalent length and resistivity), such conductors generally populate a small fraction of the overall area on a given level. In at least one embodiment using reticulated conductors, the ILD planarizes during deposition, thus obviating the need for a CN4P or etchback step after deposition. In an alternate embodiment, CMP polish time may be reduced dramatically.

In accordance with the present invention, a method is described herein for constructing a planarized dielectric over a patterned conductor and adjacent regions on a semiconductor device. This method comprises depositing a layer of conducting material on a substrate, and removing the layer of conducting material in a circumscribing region, thereby defining a location for and peripheral walls for a conductor. The method further comprises removing the layer of conducting material from one or more regions within the circumscribing region to form internal walls for the conductor (both removing conducting material steps are preferably performed simultaneously). The current-carrying capability for the conductor is thereby divided amongst two or more integrally-formed conducting segments of smaller minimum horizontal dimension than the overall conductor width. The method may further comprise forming an insulating layer over the conductor and the substrate, preferably by a method which selectively planarizes features in order of smallest to largest, based on minimum horizontal dimension (and more preferably by a method of simultaneous chemical vapor deposition and back-sputtering).

An insulating seed layer may be deposited prior to a back-sputtered deposition, as well as a conventional CVD overlayer (i.e. without significant back-sputter) deposited after a back-sputtered deposition. Alternately, a selectively planarizing deposition may be deposited as a spin-coated dielectric. The conducting segments may be formed at a size and/or spacing equivalent to minimum design rules for the semiconductor device. The device may be chemical mechanical polished after deposition, e.g. to further enhance planarity.

A method is described herein for forming a planarized insulated interconnection structure on a semiconductor device. This method comprises depositing a first layer of conducting material on a substrate, and removing sections of the first layer in a predetermined pattern to form a plurality of conducting regions. At least one of the conducting regions is formed as a reticulated conductor, comprising a set of conducting segments integrally-formed to provide multiple conducting paths between opposing ends of the conductor. The method further comprises depositing at least one insulating layer over the conducting regions and substrate by a method of simultaneous deposition and back-sputtering (preferably CVD and back-sputtering, preferably using constituent gasses silane, $O_2$, and argon). The method may further comprise chemical mechanical polishing of the insulating layer. The method may further comprise depositing and patterning a second layer of conducting material over the insulating layer.

The present invention further comprises a metallization structure on a semiconductor device, comprising a plurality of first conducting regions formed on a substrate. At least one of the first conducting regions is a non-reticulated conductor, and at least one of the first conducting regions is a reticulated conductor, comprising a set of conducting segments (preferably formed at a size and/or spacing equivalent to minimum design rules for the device) integrally-formed to provide multiple conducting paths between opposing ends of the reticulated conductor. The structure further comprises one or more insulating layers overlying the first conducting regions and the substrate and providing a top surface which is locally (measured within a 10 $\mu$m radius) planar to at least 3000 Å. The structure may further comprise a plurality of second conducting regions formed over the insulating layers, at least one of the second conducting regions electrically connected to at least one of the first conducting regions through the insulating layers.

BRIEF DESCRIPTION OF THE DRAWINGS

This invention, including various features and advantages thereof, can be best understood by reference to the following drawings, wherein.

DETAILED DESCRIPTION OF THE PREFERRED EMBODIMENTS

Figure 1:
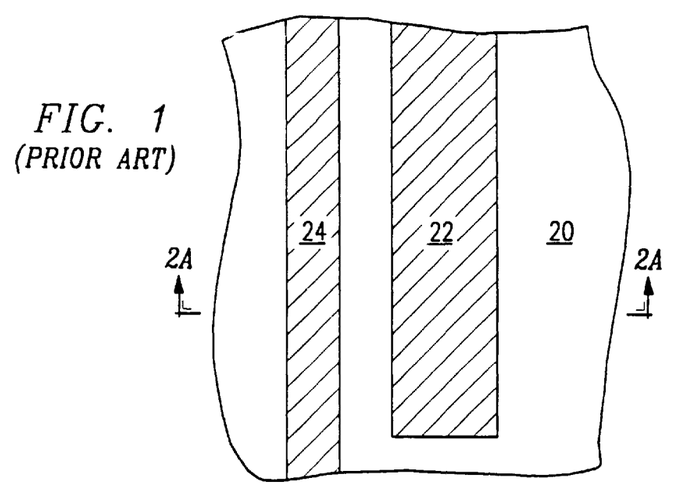
FIGS. 1 and 2A–2C show, respectively, a plan view and cross-sectioned elevations taken along section line 2A—2A, of a prior art method of planarizing an ILD.
Figure 2A:
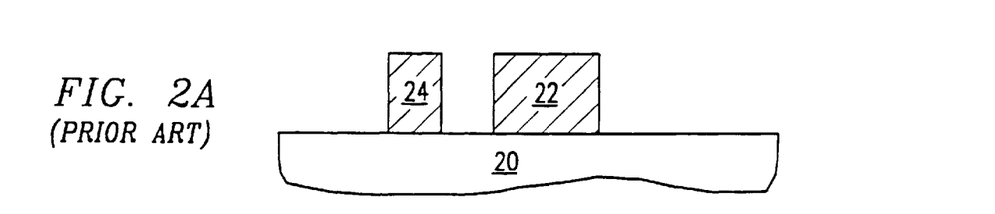
Figure 2B:
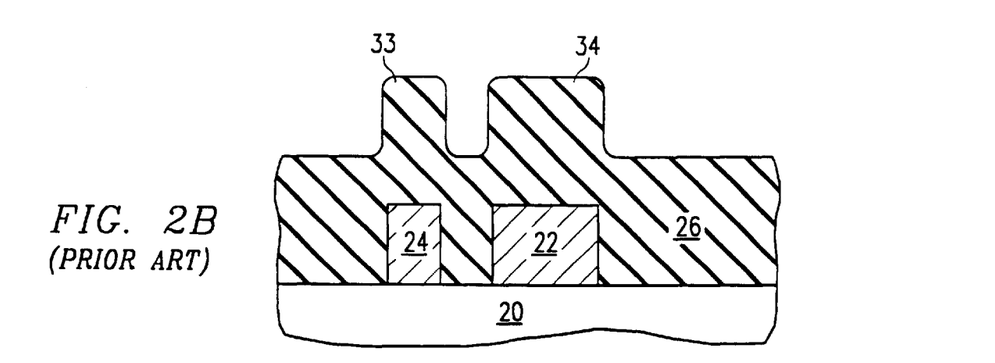
Figure 2C:
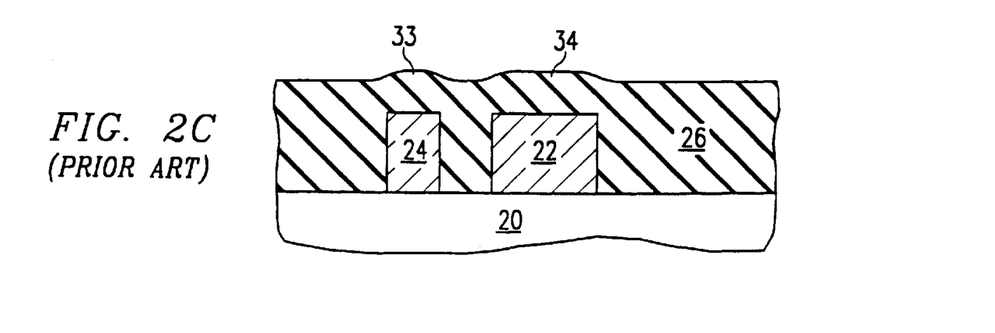

It has long been the practice in semiconductor design to form patterned conductors of different widths. For example, widths are often adjusted based on current-carrying requirements for a given conductor, such that reliability problems (e.g. electromigration) may be avoided. Where low currents are expected, conductor size is however limited to a minimum width specific to a given device and/or semiconductor fabrication process. FIG. 1 shows a plan view of two conductors (e.g. of Al 0.05% alloy) formed on a substrate 20 (e.g. with a top $SiO_2$ insulating layer), conductor 22 representing a large conductor of twice minimum width (much larger conductors usually exist on a given circuit layout) and conductor 24 representing a minimum width conductor. FIG. 2A shows a cross-sectioned elevation of the same conductors. FIG. 2B shows the conductors after deposition of an ILD 26 by a known method (e.g. PETEOS, or plasma-enhanced tetraethylorthosilicate, deposition) which forms a generally conformal layer having rectangular ridges 33 and 34 overlying conductors 24 and 22. These ridges usually require planarization by one of the previously described methods before another conducting layer can be layed over ILD 26, resulting in improved planarization as shown in FIG. 2C.

Figure 3A:
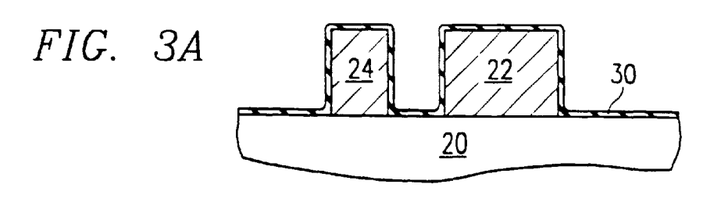
FIGS. 3A–3D show cross-sectioned elevations of a method of constructing a planarized ILD.

An ILD silicon dioxide deposition technique has now been developed which improves planarization over such conductors, herein referred to as high density plasma (HDP) deposition. HDP deposition comprises, for example, the following steps: a wafer (containing the substrate) is mounted in a reaction chamber such that backside helium cooling may be used to control temperature; the chamber is then evacuated to 7 millitorr, and a mixture of 68 sccm $O_2$ and 100 sccm Ar are supplied to the chamber; 2500 W of source rf power are used to create a plasma (which also heats the wafer), and the temperature of the wafer is stabilized at approximately 330 C. by backside cooling; after 50 seconds of operation, 50 sccm silane is also introduced into the chamber, causing a silane oxide to deposit on the wafer (shown as seed layer 30 in FIG. 3A); after 56 seconds of operation, 1600 W of bias power is applied to initiate back-sputtering; at this point, net deposition rate drops to 40 Å/sec, as some of the oxide being deposited sputters back off. During such an HDP deposition, it is believed that back-sputtering preferentially affects oxide along the top edges of a conductor, eventually building a triangular cross-section ridge along such a conductor.

Figure 3B:
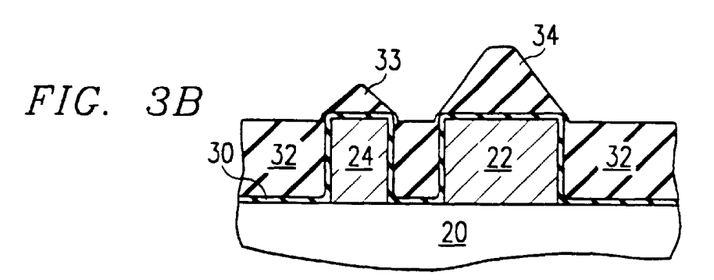

FIG. 3B illustrates one possible ILD cross-section after deposition of an HDP ILD 32 approximately to the depth of conductors 22 and 24. Ridge 33 over conductor 24 has a generally triangular cross-section and a very low net deposition rate by this point. In contrast, ridge 34 has not yet formed a triangular peak and is still growing at roughly the same rate as ILD being deposited over the substrate areas.

Figure 3C:
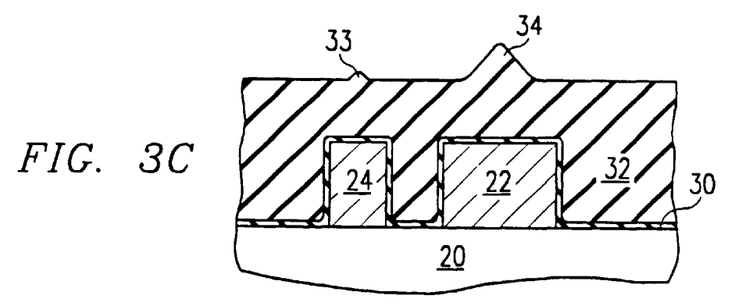

If HDP deposition is continued as shown in FIG. 3C, ridge 34 peaks even as the bases of ridges 33 and 34 are swallowed by the HDP deposition growing from the substrate. This forms an ILD with planarization superior to that of the prior art PETEOS example of FIG. 2B. Ridge 34 is less planarized than ridge 33 which formed over a minimum width conductor. This trend may be generalized: i.e., for a given deposition depth narrower conductors are better planarized by the HDP deposition than wider conductors. Thus for a given deposition thickness and maximum desired deviation from planarity, a critical width may be determined such that conductors narrower than the critical width are sufficiently planarized by HDP deposition alone. For instance, it has been found that for a conductor thickness of 7500 Å and an HDP oxide thickness of 10000 Å, conductors narrower than about 0.45 µm will meet a 1000 Å planarity requirement after HDP deposition.

Figure 3D:
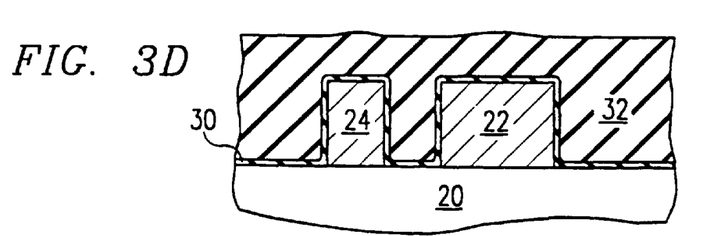

Planarization of the ILD having imbedded conductors wider than the critical width may still require, e.g., a CMP step after HDP deposition. In general, CMP is more effective on an HDP oxide ILD than a PETEOS ILD (possibly because of the smaller, narrower ridges), resulting in the highly planar ILD 32 shown in FIG. 3D. This advantage may not be clear, however, for structures with extremely wide conductors (e.g. 10×minimum width) imbedded therein, which are poorly planarized by the HDP process. Because of this phenomenon, it may be preferable to only partially build an ILD using, HDP oxide (e.g. to the level shown in FIG. 3B) and complete the ILD using PETEOS, silane-deposited oxide, or a similar technique which deposits faster than HDP oxide.

One alternate method for producing a selectively-planarizing insulating layer is as a spin-coated dielectric. For example, hydrogen silsesquioxane available from Dow Corning may be spin-coating onto a wafer containing substrate 20 and conductors 22 and 24 to produce an insulating layer. The deposition profile may be made similar to that of layer 32 in FIG. 3B or FIG. 3C (albeit less angular by nature and may or may not requiring seed layer 30), by adjusting viscosity of the spin-coating before application to the wafer and/or adjusting wafer spin rate (rates of 1000 to 6000 rpm are typical). Insulating layer thicknesses of 0.2 µm to 1 µm (as measured on an unpatterned wafer or open field on a patterned wafer) are easily fabricated by such a method. It is preferable to construct only a partial ILD by a spin-on technique (e.g. to the level of layer 32 in FIG. 3B), with the remainder of the ILD formed using PETEOS or silane-deposited CVD oxide, for example.

Figure 4:
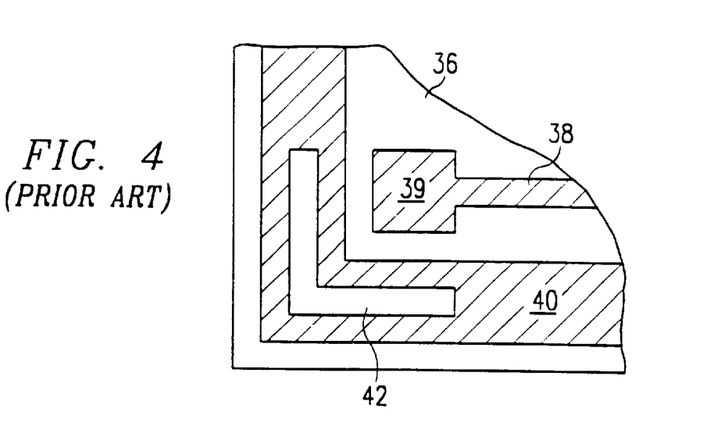
FIG. 4 shows a plan view of a prior art slit structure used to prevent cracking of a passivation layer due to stresses incurred during resin mold packaging.

It is known that for semiconductors packaged in resin-molded packages, large conductors near the corners of a chip may be formed with slits or rows of small holes to alleviate stress cracking of the top passivation layer during packaging (U.S. Pat. No. 4,625,227, Hara et al., Nov. 25, 1986). As shown in FIG. 4, on a substrate 36 are formed a wire lead 38 connected to a bond pad 39 and a guard ring (e.g. a $V_{cc}$ power bus) 40 surrounding such bond pads. A slit 42, formed at the corner of guard ring 40, reduces the width of a typically 100 µm to 200 µm conductor to 40–80 µm segments in the corner regions, thereby preventing the overlying passivation layer from cracking during packaging.

It has now been discovered that slits or small holes formed in a large conductor, when combined with a planarizing ILD deposition such as HDP oxide or a spin-coated dielectric, may advantageously increase planarization of such an ILD. Slits or small holes such as those disclosed in the '227 patent generally do not provide such a feature: they are meant for top-level metallization, where planarization is generally unimportant and a planarizing deposition has little advantage; only portions of certain conductors contain the slits, leaving many large conductors and partially-slitted conductors, such that only small regions of the overall chip surface might see any improvement at all (with the dimensions discussed in the '227 patent, HDP deposition would not planarize even in the vicinity of the slits); slit 42 creates a section of increased resistivity in conductor 40, which may cause electromigration if conductor 40 carries significant current.

Conductors and conducting regions patterned according to the present invention are described as reticulated; that is, a pattern of slits or holes is created in a conductor, breaking the conductor into a set of integrally-formed conducting segments. To achieve maximum planarization benefit, such a pattern is preferably: created using minimum design rules; repeated along an entire large (greater than critical width) conductor; and included on every large conductor on a lower-level metallization (this may not be required, e.g., if part of the lower-level metallization has no conductors overlying it). Also, it is preferred to maintain an appropriate conductor cross-section for the current requirements of a given conductor; i.e. cutting holes in an existing conductor without increasing overall conductor width is not preferred (unless the conductor width was overdesigned to start with).

Figure 5:
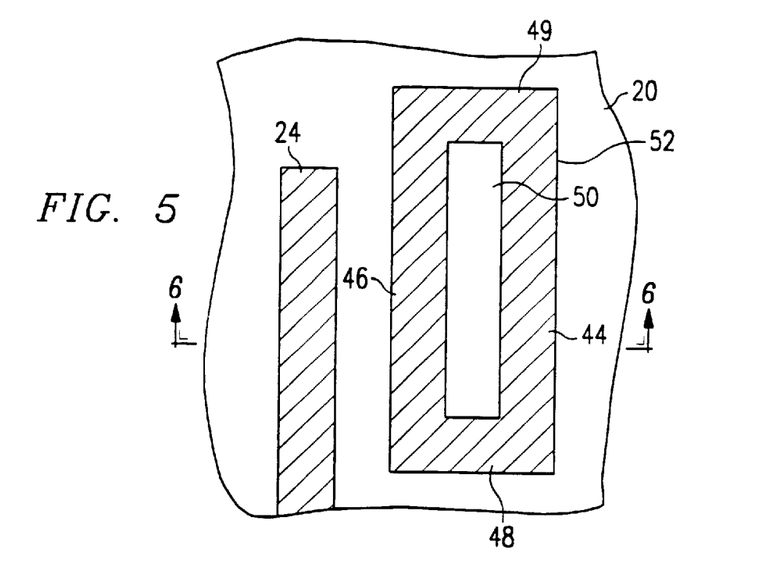
FIGS. 5 and 6 show, respectively, a plan view and a cross-sectioned elevation taken along sectin line 6—6 of a conductor/ILD embodiment of the invention.

In accordance with the present invention, FIG. 5 shows a reticulated conductor 52 and a minimum width conductor Z4 formed on a substrate 20. Reticulated conductor 52 has an interior region 50 where conducting material has been removed. Such a conductor may be designed directly into the mask pattern, such that interior region 50 is created at the same time as the outer walls of the conductor. Conductor 52 can be described as comprising a set of connected conducting segments: right segment 44, left segment 46, bottom segment 48, and top segment 49. Segments 44 and 46 provide multiple current paths between top and bottom segments 49 and 48.

Figure 6:
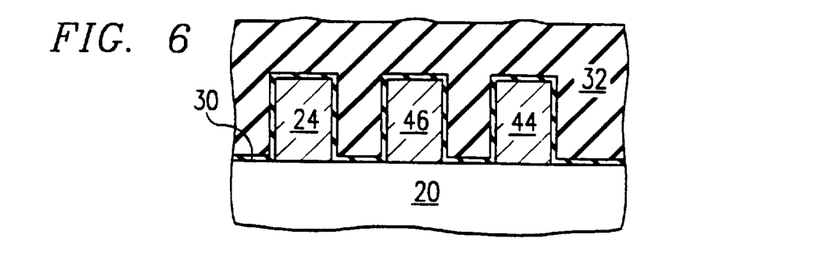

FIG. 6 contains a cross-sectional elevation of FIG. 5, taken through small conductor 24 and left and right segments 46 and 44 along section line 6—6. A seed layer 30 and HDP oxide layer 32 deposition are shown to illustrate the excellent ILD planarity achievable above the conductor segments 44 and 46, as well as conductor 24, where widths of such are all smaller than the critical width.

Figure 7:
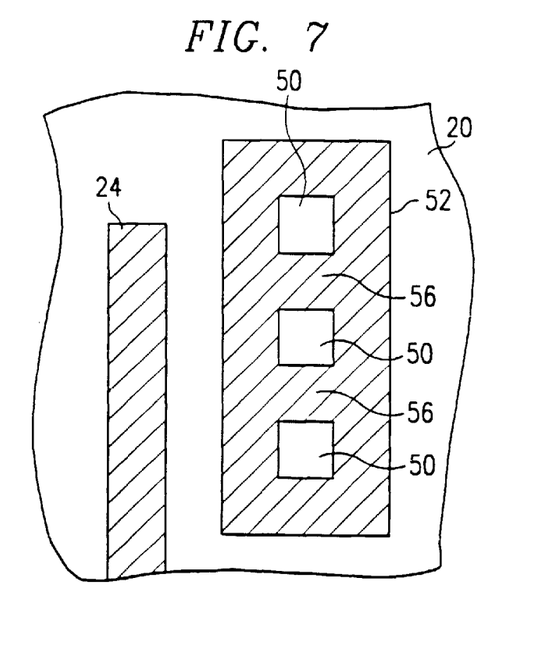
FIGS. 7–11 show plan views of various embodiments of a reticulated conductor which may be usable in the invention.
Figures 8, 9:
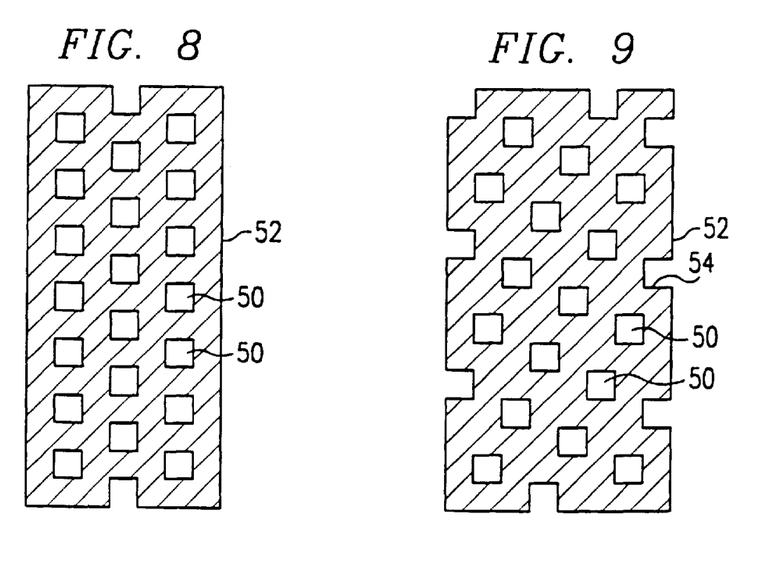
Figure 10:
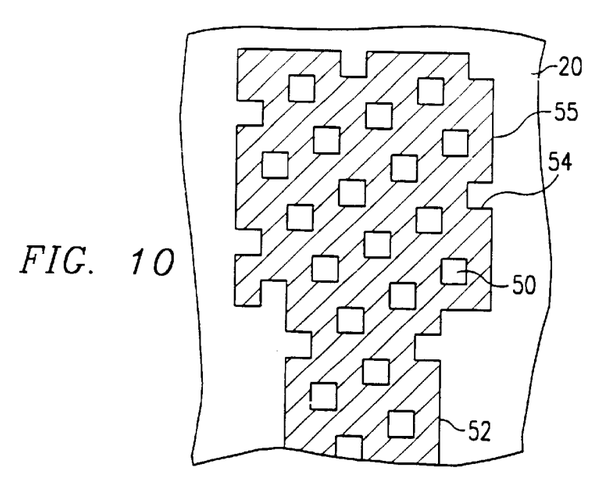
Figure 11:
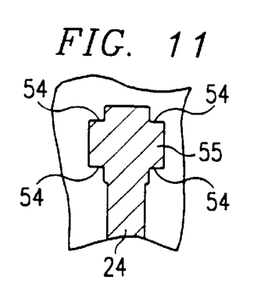

FIG. 7 shows a reticulated conductor 52 containing two cross-conducting segments 56 and three non-conductive interior regions 50 surrounded thereby. Such an arrangement has less resistance and more redundant conduction paths than conductor 52 in FIG. 5, and yet planarizes comparably. For conductors requiring a cross-section generally greater than three times minimum, more elaborate segment layouts, such as those shown for reticulated conductors 52 in FIGS. 8 and 9 may be chosen. Note that in these reticulation patterns individual conducting segments are less distinct; however, conducting segment size may be defined by a "minimum horizontal dimension" measured between neighboring regions 50. FIG. 10 shows a reticulated conductor 52 with a landing pad 55 on an end. Reticulation schemes may produce both interior regions 50 and notch regions 54, as illustrated in both FIGS. 9 and 10. In an extreme case, each as landing pad 55 connected to minimum-width conductor 24 in FIG. 11, only notch regions 54 may be included in the reticulation pattern.

Figure 12:
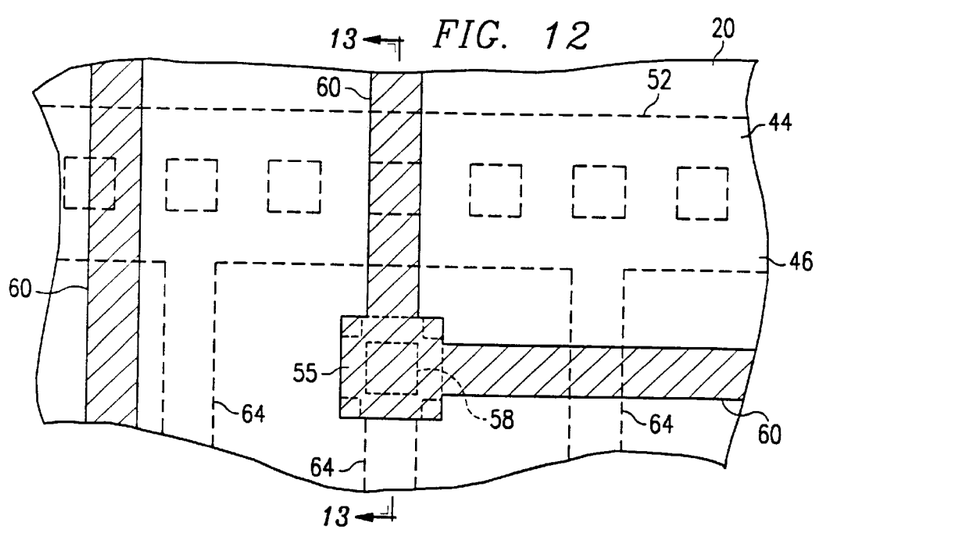
FIGS. 12 and 13 show, respectively, a plan view and a cross-sectioned elevation taken along section line 13—13 of two conducting levels illustrative of the invention.
Figure 13:
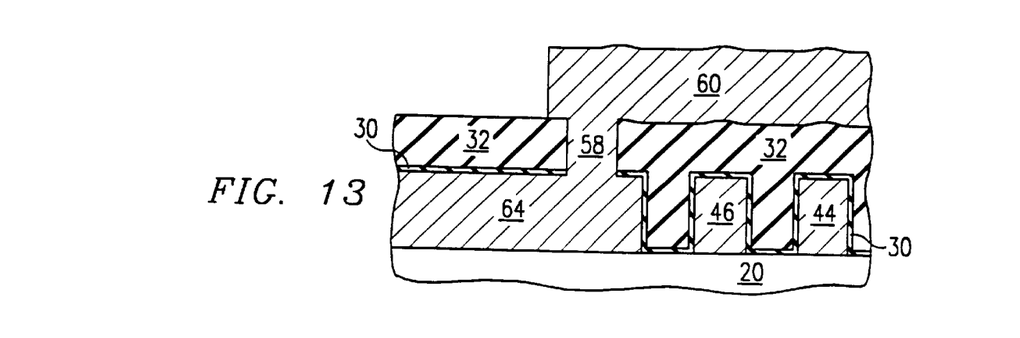

FIG. 12 is a plan view illustrating a portion of two levels of conductors. The first level of conductors contains a reticulated conductor 52 and three non-reticulated conductors 64, two of which terminate at conductor 52 and one of which terminates at reticulated landing pad 55. The latter conductor is electrically connected through via 58 to one of the second level conductors 60 (the second level may or may not contain reticulated conductors). In the cross-sectional elevation taken along line 13—13 and shown in FIG. 13, HDP ILD 32 and second-level conductor 60 both exhibit the high degree of planarity achievable with a reticulated conductor and an appropriate ILD deposition method.

Reticulated conductors fabricated in accordance with the present invention may be designed with segments of greater than critical width. Although the region above such conductors may still require planarization after ILD deposition, it has been found that such a reticulated conductor/ILD generally polishes down faster with CMP than an equivalent non-reticulated conductor/ILD. This may be useful, for instance, to reduce CMP polish time where CMP for a conductor/ILD level is unavoidable because of other constraints.

The invention is not to be construed as limited to the particular examples described herein, as these are to be regarded as illustrative, rather than restrictive. The principles discussed herein may be used to design many other reticulation patterns not shown herein which produce the same effect. Other ILD deposition techniques may be applicable to the present invention under appropriate conditions, including sequential deposition and back-sputter cycling (as opposed to continuous simultaneous deposition and back-sputtering), combined sputter/back-sputter techniques, and methods requiring no seed layer. The seed layer itself may be produced by many known processes, if such a layer is included. A deposition+back-sputter method may, for instance, only be used for one layer of the overall ILD, with the remainder formed from a conformal deposition. Other materials such as silicon nitride and silicon oxynitride may be included in the ILD. A large variety of dielectric materials may be applicable to ILD deposition by spin-on technique, since selective planarization for such a deposition is primarily a function of viscosity and wafer spin rate. The conductors themselves may be formed of virtually any conducting materials compatible with a semiconductor process (or include non-conducting sublayers), since patterned conductors tend to exhibit similar shape irrespective of composition.

What is claimed is:

1. A metallization structure on a semiconductor device, said structure comprising:
   (a) a plurality of first conducting regions formed on a substrate,
      at least one of said first conducting regions being a non-reticulated conductor
      and at least one of said first conducting regions being a reticulated conductor, said reticulated conductor comprising a set of conducting segments connected to provide multiple conducting paths between opposing ends of said reticulated conductor;
   (b) at least one insulating layer overlying said first conducting regions and said substrate, the uppermost of said insulating layers providing a top surface which is locally planar to at least 3000 Å; and
   (c) a plurality of second conducting regions formed over said insulating layers, at least one of said second conducting regions electrically connected to at least one of said first conducting regions through said insulating layers;
      whereby planarity of said insulating layers is at least partially effected by use of said reticulated conductor instead of a non-reticulated conductor of equivalent resistivity and length.

2. The structure of claim 1, wherein said conducting segments of said reticulated conductor are formed at a size and/or spacing equivalent to minimum design rules for said semiconductor device.

3. The structure of claim 1, wherein said conducting segments define a plurality of openings in said reticulated conductor which are staggered across said conductor.

4. The structure of claim 1, wherein said conducting segments define a plurality of openings in said reticulated conductor which are staggered lengthwise along said conductor.

5. The structure of claim 1, wherein said at least one insulating layer comprises two insulating layers.

6. A metallization structure on a semiconductor device, said structure comprising:
   a plurality of first conducting regions formed on a substrate,
      said first conducting regions comprising at least one reticulated conductor comprising a set of conducting segments connected to provide multiple conducting paths between opposing ends of said reticulated conductor;
   at least one insulating layer overlying said first conducting regions and said substrate, said layer having a substantially planar upper surface; and
   a plurality of second conducting regions formed over said insulating layer, at least one of said second conducting regions electrically connected to at least one of said first conducting regions through said insulating layer.

7. The structure of claim 6, wherein said conducting segments of said reticulated conductor are formed at a size and/or spacing equivalent to minimum design rules for said semiconductor device.

8. The structure of claim 6, wherein said conducting segments define a plurality of openings in said reticulated conductor which are staggered across said conductor.

9. The structure of claim 6, wherein said conducting segments define a plurality of openings in said reticulated conductor which are staggered lengthwise along said conductor.

10. The structure of claim 6, wherein said at least one insulating layer comprises two insulating layers.

* * * * *